United States Patent
Tang et al.

(10) Patent No.: US 8,363,705 B2
(45) Date of Patent: Jan. 29, 2013

(54) DIFFERENTIAL DRIVER WITH COMMON MODE VOLTAGE TRACKING AND METHOD

(75) Inventors: Bill R-S Tang, San Jose, CA (US); Paul Ta, Fremont, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 13/211,915

(22) Filed: Aug. 17, 2011

(65) Prior Publication Data

US 2011/0299577 A1    Dec. 8, 2011

Related U.S. Application Data

(63) Continuation of application No. 11/838,069, filed on Aug. 13, 2007, now Pat. No. 8,027,377.

(60) Provisional application No. 60/862,007, filed on Oct. 18, 2006, provisional application No. 60/822,301, filed on Aug. 14, 2006.

(51) Int. Cl.
*H04B 1/38* (2006.01)

(52) U.S. Cl. .......................................... 375/220

(58) Field of Classification Search ............... 375/220, 375/244

See application file for complete search history.

(56) References Cited

U.S. PATENT DOCUMENTS

| | | |
|---|---|---|
| 2005/0035789 A1 | 2/2005 | Tamura |
| 2006/0158223 A1 | 7/2006 | Wang |
| 2007/0004372 A1 * | 1/2007 | Adams et al. ................. 455/333 |

* cited by examiner

*Primary Examiner* — Kevin Kim
(74) *Attorney, Agent, or Firm* — Fogg & Powers LLC

(57) ABSTRACT

In a transceiver, a transmitter circuit is provided substantially the same common-mode voltage regardless of whether the transceiver is in a transmitting or receiving mode. In one embodiment, the transmitter circuit includes a driver circuit which, in the transmission mode of the transceiver, drives an output differential signal, and which, in the receiving mode of the transceiver, provides a termination circuit for an input differential signal. A variable resistor is provided to connect between a supply voltage and the driver circuit, the resistance of the variable resistor is selected such that the common-mode voltage of the output differential signal of the transmission mode substantially equals the common-mode voltage in the input differential signal of the receiving mode.

22 Claims, 3 Drawing Sheets

DIFFERENTIAL DRIVER WITH COMMON MODE VOLTAGE TRACKING AND METHOD

CROSS-REFERENCE TO RELATED APPLICATIONS

The present application is a continuation of U.S. patent application Ser. No. 11/838,069, filed on Aug. 13, 2007, which claims the benefit of priority to U.S. Provisional Application Ser. No. 60/862,007, filed on Oct. 18, 2006, which claims the benefit of priority to U.S. Provisional Application Ser. No. 60/822,301, filed on Aug. 14, 2006, the disclosures of which are incorporated herein by reference.

BACKGROUND

The present invention relates to high speed data communication (e.g., 1 Gbit/second or higher). In particular, the present invention relates to a bidirectional differential driver that maintains the same common-mode voltage for sending and receiving differential signals.

Current-mode low-swing differential signals (LVDS) are often used in high speed data links to reduce electromagnetic interference (EMI), power consumption and noise interference. When a signal is transmitted over a significant distance between a transmitter and a receiver over copper wires, a technique—known as "AC coupling"—prevents a DC current from flowing between the receiver and transmitter as a result of a difference in ground or power supply voltages between the transmitter and the receiver on opposite sides of the transmission. AC coupling may be accomplished by inserting blocking capacitors into the communication link. This isolation technique allows two different common-mode voltages to exist at the transceivers at the ends of the communication channel. However, the different common-mode voltages may be limited or may cause errors, especially for bidirectional communication over a single communication link.

Full duplex is the preferred mode of bidirectional data communication. However, full-duplex bidirectional communication requires echo cancelling, and thus full-duplex mode is available only in low-speed data communication. At 1-Gbit/second or higher data rate, half-duplex mode is typically used. FIG. 1 shows schematically a bidirectional communication through link 100. At each end, a transceiver—consisting of both a transmitter and a receiver—performs the transmission and reception functions. For example, FIG. 1 shows transceivers 120 and 121. Transceiver 120 is shown to include transmitter 101 and receiver 102. Similarly, transceiver 121 is shown to include transmitter 103 and receiver 104. When transceiver 120 is in the transmitting mode, transceiver 121 is in the receiving mode. Within transceiver 120, when transmitter 101 is active (i.e., the transmission mode), receiver 102 is inactive. Conversely, in the receiving mode, transmitter 101 is inactive. In AC-coupled communication link 100, when transceiver 120 switches from a transmitting mode to a receiving mode, receiver 102's differential front end may experience an instantaneous large swing or surge in common-mode voltage, when the common-mode voltages are different between transmit and receive modes. Such a voltage surge overlaps in time with the incoming signal and may overwhelm and blind receiver 102 until the surge condition settles down to within the receiver detection limits. When such a condition occurs, the receiver may lose its function until the common-mode voltage surge falls into the sensitivity range of the receiver. In a system where a differential termination resistor of 100 ohms and a blocking capacitor of 1 nF are used, the receiver may be blinded for a few hundred nanoseconds (ns). During this period, communication over the communication link is not possible.

FIG. 2 illustrates, in further detail, a general AC-coupled bidirectional communication system without common-mode voltage control. FIG. 2 shows the transmission systems of transceivers 200 and 250, which communicates over a communication link 270. As shown in FIG. 2, transceiver 200 includes transmitter 201 and receiver 202. Transceiver 250 is substantially identical to transceiver 200, except that transmitter 251 is disabled during receiving by grounding the input terminals of transmitter 251's differential driver circuit. In this configuration, transmitter 251 acts as a termination circuit during the receiving mode of transceiver 250.

FIG. 3 shows a waveform of output signal 212 from transceiver 200. As shown in FIG. 3, differential signal 212 is represented by the voltage difference between signal waveforms 212a and 212b. The common-mode voltage $V_{com\_TX}$ in differential signal 212 is given by:

$$V_{com\_TX} = \frac{V_{212a} + V_{212b}}{2},$$

where $V_{212a}$ and $V_{212b}$ are the component voltages of differential signal 212. The common-mode voltage $V_{com\_TX}$ in differential signal 212 is also given by:

$$V_{com\_TX} = V_{dd1} - \frac{V_{212a} - V_{212b}}{2} = V_{dd1} - \frac{\Delta V_1}{2},$$

where $\Delta V_1 = V_{212a} - V_{212b}$ is the voltage swing in the transmitter output during transmission, and $V_{dd1}$ is the supply voltage of transceiver 200.

FIG. 4 shows a waveform of input differential signal 214 at receiver 250 on the output side of the blocking capacitors. As shown in FIG. 4, differential signal 214 is represented by the voltage difference between signal waveforms 214a and 214b. Because the input terminals of differential pair 215a and 215b are both grounded, no DC current flows in the two 50-ohm termination resistors, so that no voltage drop across these termination resistors in transmitter 251, the voltage levels of signal waveforms 214a and 214b swing above and below supply voltage $V_{dd2}$ at termination circuit 251. The common-mode voltage $V_{com\_RX}$ in differential signal 214 is given by:

$$V_{com\_RX} = \frac{V_{214a} + V_{214b}}{2},$$

where $V_{214a}$ and $V_{214b}$ are the component voltages of differential signal 214. The common-mode voltage $V_{com\_RX}$ in this instance equals supply voltage $V_{dd2}$, and the voltage levels of differential signal 214 are $$V_{dd2} + \frac{\Delta V_2}{2} \text{ and } V_{dd2} - \frac{\Delta V_2}{2}.$$

As illustrated by this example, the difference in common-mode voltage between transmission mode and receiving mode can be 50% of the differential signal swing. In such circumstances, the receiver may require as much time as 5 times the relevant RC time constant (i.e., 500 ns) to settle to less than 1% of this difference. In addition to all the possible variations in the manufacturing process, the supply voltage and temperature changes during operations, additional factors, such as (i) tail current boost-up, and (ii) pre-emphasis techniques can influence the common-mode voltage of a transmitter. These techniques are common in high-speed data communication, where high frequency loss is compensated in a long or lossy link.

In a bidirectional link, maintaining or tracking the common-mode voltage in a transceiver for both transmitting and receiving modes is essential to minimize the blind period during mode switching.

SUMMARY

According to one embodiment of the present invention, a transceiver maintains substantially the same common-mode voltage in a transmitting mode as in a receiving mode. A transmitter circuit in the transceiver includes a driver circuit which, in the transmission mode of the transceiver, drives an output differential signal, and which, in the receiving mode of the transceiver, provides a termination circuit for an input differential signal. In one embodiment, the common-mode voltage is maintained when the transceiver switches from the transmitting mode to the receiving mode, and vice versa, by a resistive network.

The present invention is better understood upon consideration of the detailed description below and the accompanying drawings.

BRIEF DESCRIPTION OF THE DRAWINGS

To facilitate cross-referencing, like elements in the figures are assigned like reference numerals.

DETAILED DESCRIPTION

The present invention provides a new transceiver that provides substantially the same common-mode voltage whether the transceiver is in a transmitting mode or in a receiving mode.

Figure 1:
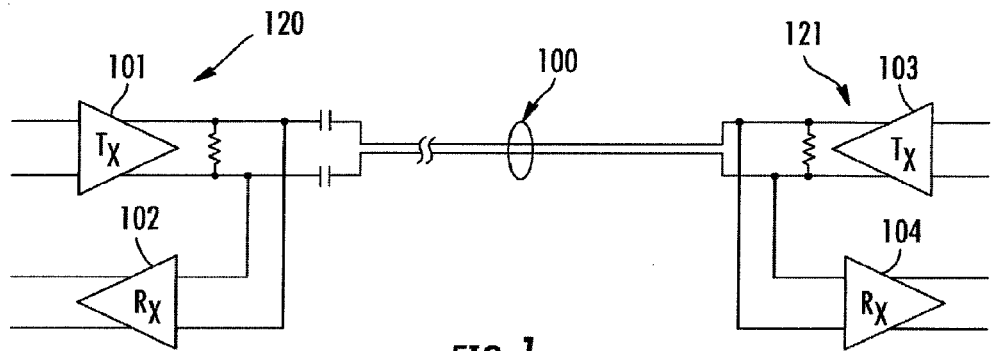
FIG. 1 shows schematically a bidirectional communication link 100.
Figure 2:
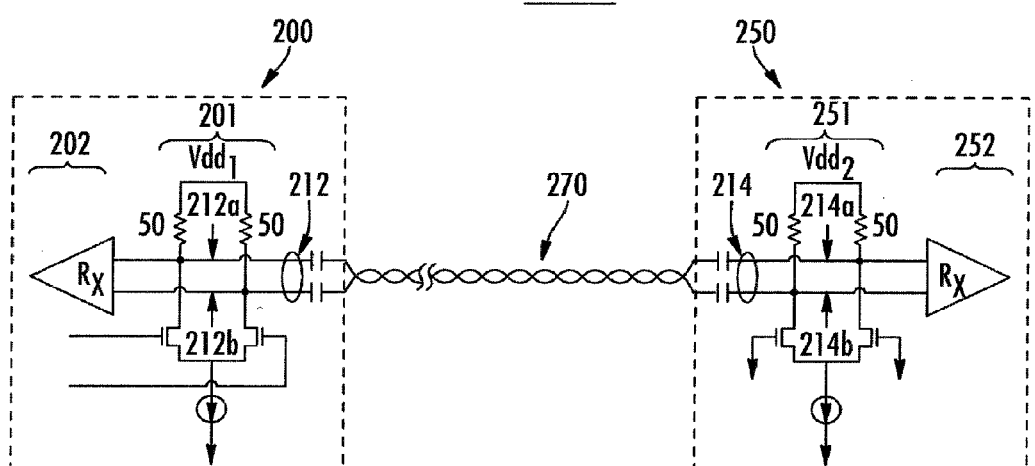
FIG. 2 shows the transmission circuits in communicating transceiver 200 in transmission mode and transceiver 250 in receiving mode over a communication link 270.
Figure 3:
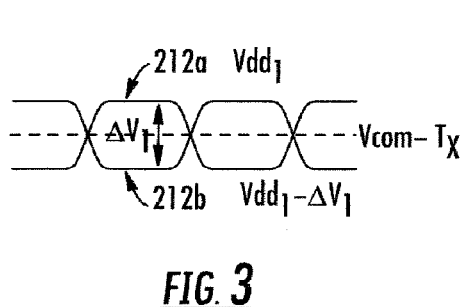
FIG. 3 shows a waveform of output signal 212 from transceiver 200.
Figure 4:
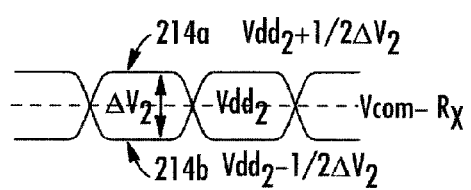
FIG. 4 shows a waveform of input differential signal 214 at receiver 250.
Figure 5A:
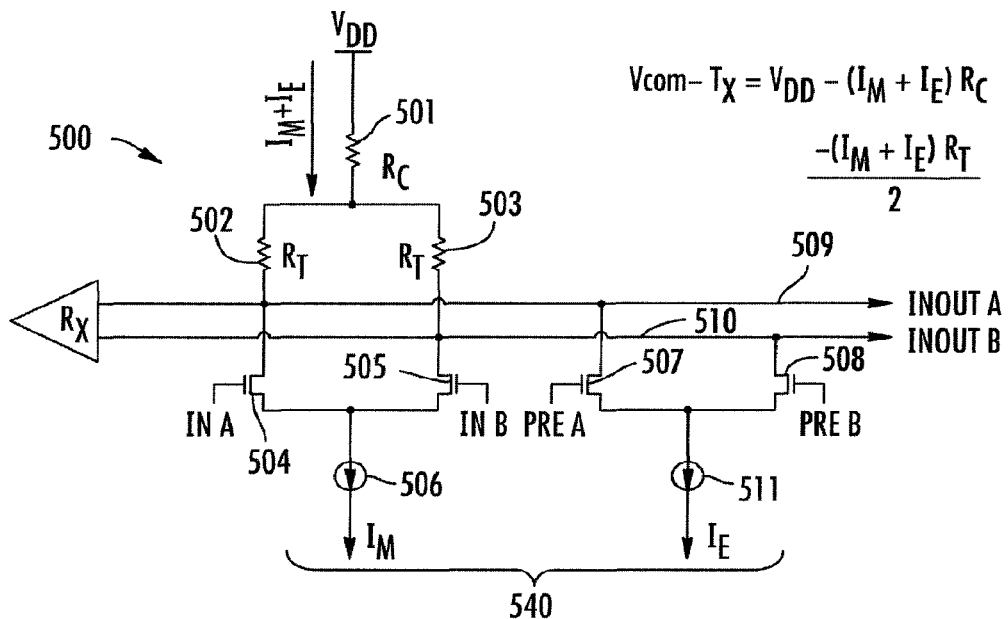
FIG. 5a shows a circuit model for transceiver circuit 500 during a transmission operation, according to one embodiment of the present invention.

FIG. 5a shows a circuit model for transceiver circuit 500 during a transmission operation, according to one embodiment of the present invention. As shown in FIG. 5a, transceiver 500 includes a common-mode voltage control resistor 501, having resistance $R_C$, provided between supply voltage $V_{DD}$ and a common terminal of termination resistors 502 and 503, each having a resistance $R_T$. Resistors 501, 502 and 503 are assigned these resistance values to allow common-mode voltage control. During transmission, signals INA and INB are provided at the differential input of transistor 504 and 505 in transceiver 500. The differential pair 504 and 505 are the main output driver transistors of output terminals 509 and 510. Signals PREA and PREB are provided as differential input signals to drive pre-emphasis output driver transistors 507 and 508. In this configuration, the common mode voltage during transmission mode is given by:

$$V_{com\_TX} = \frac{V_{INOUTA} + V_{INOUTB}}{2}$$
$$= V_{DD} - \left((I_M + I_E)R_C + \frac{(I_M + I_E)R_T}{2}\right)$$
$$= V_{DD} - (I_M + I_E)\left(R_C + \frac{R_T}{2}\right)$$

As shown in FIG. 5a, $V_{com\_TX}$ depends both on main tail current $I_M$ and pre-emphasis current $I_E$ at fixed $R_C$ and $R_T$.

Figure 5B:
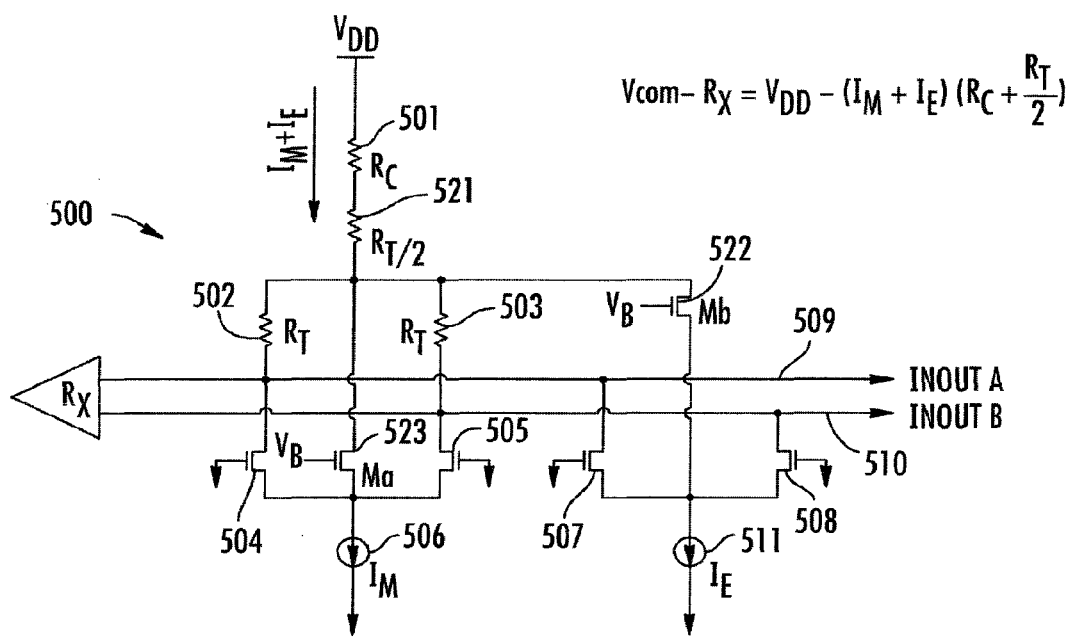
FIG. 5b shows a circuit model for transceiver circuit 500 during a receiving operation, according to one embodiment of the present invention.

FIG. 5b shows a circuit model for transceiver circuit 500 during a receiving operation, according to one embodiment of the present invention. As shown in FIG. 5b, in addition to the elements of transceiver circuit 500 shown in FIG. 5a, the circuit model in FIG. 5b includes resistor 521, having a resistance $$\frac{R_T}{2}$$

(i.e., one-half of the resistance of each of termination resistors 502 or 503), and transistors 522 and 523. During a receiving mode, the main output driver transistors 504 and 505 and pre-emphasis driver transistors 507 and 508 are rendered non-conducting by grounding their respective input terminals. Transistors 522 and 523 allow tracking in the receiving mode the common-mode voltage established in the transmission mode by the values of main tail current $I_M$ and pre-emphasis current $I_E$. Transistors 522 and 523 are biased at input voltage $V_B$, which is selected to maintain in the receiving mode the same DC current (i.e., both of the currents in main output driver $I_M$ and pre-emphasis driver $I_E$) as in the transmission mode. In this manner, a suitable voltage drop across the common mode voltage control resistors 501 and 521 is achieved. In this configuration, the common mode voltage $V_{com\_RX}$ of transceiver 500 during a receiving mode is given by:

$$V_{com\_RX} = \frac{V_{INOUTA} + V_{INOUTB}}{2} = V_{DD} - (I_M + I_E)\left(R_C + \frac{R_T}{2}\right),$$

which is equal to the $V_{com\_TX}$ illustrated in FIG. 5a. Thus, no surge or very small variation in common-mode voltage would be seen when transceiver 500 switches from a transmission mode to a receiving mode.

Figure 5C:
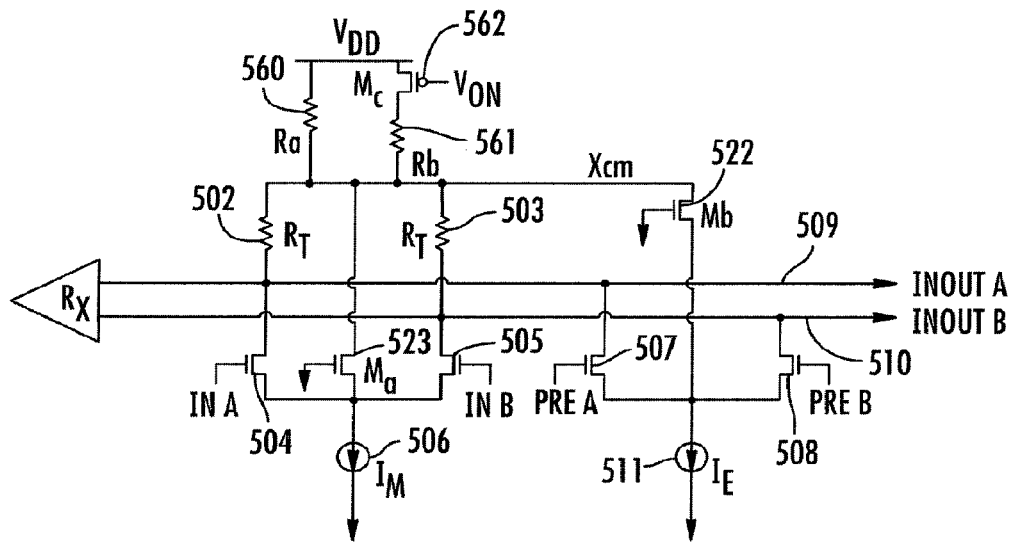
FIG. 5c shows one implementation for transceiver circuit 500, together with relevant input and control voltages during a transmission operation, according to one embodiment of the present invention.

FIG. 5c shows one implementation for transceiver circuit 500, together with relevant input and control voltages during transmission, according to one embodiment of the present invention. As shown in FIG. 5c, transistor 562 is provided as a switch to connect and to disconnect resistor 561 (having resistance $R_b$) in a parallel resistive circuit with resistor 560 (having resistance $R_a$), during a transmission mode and a receiving mode, respectively. During the transmission mode, transistor 562 is rendered conducting by biasing voltage $V_{ON}$, such that the parallel resistive circuit[1], including transistor 562 (with "on-resistance" $R_M$), can effectively realize the resistance $R_C$ as illustrated in FIG. 5*a*. As seen in FIG. 5*c*, transistor 522 and 523 are rendered non-conducting (i.e., open circuits) by grounding their respective input terminals.

[1] Resistance of the parallel resistive circuit is given by:

$$R_a \parallel (R_M + R_b) = \frac{R_a(R_M + R_b)}{R_a + R_M + R_b}$$

Figure 5D:
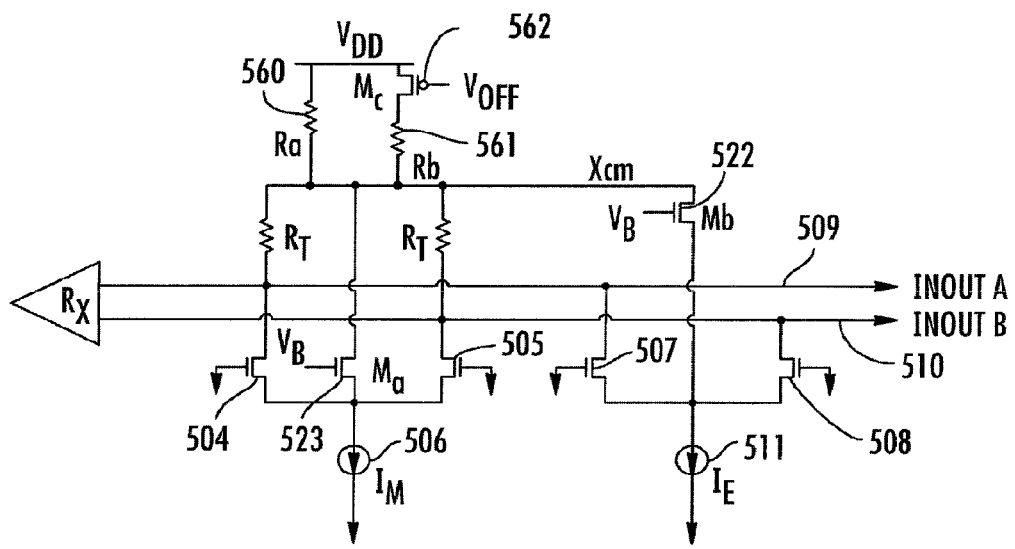
FIG. 5d shows one implementation for transceiver circuit 500, together with relevant input and control voltages during a receiving operation, according to one embodiment of the present invention.

Similarly, as shown in FIG. 5*d*, during a receiving mode, transistor 562 is rendered an open circuit by biasing voltage $V_{OFF}$, such that resistor 560 (with resistance $R_a$) which was deliberately chosen to have the value $(R_C+R_T/2)$ as showing in FIG. 5*b*. In this configuration, transistors 522 and 523 are biased by voltage $V_B$ such that their currents can mimic main tail current $I_M$ and pre-emphasis current $I_E$ during transmission mode.

The detailed description above is provided to illustrate the specific embodiments of the present invention and is not intended to be limiting. Numerous variations and modifications within the scope of the present invention are possible. The present invention is set forth in the following claims.

What is claimed is:

1. A transceiver circuit, comprising:
a transmitter circuit enabled to transmit a first plurality of differential signals during a transmission mode of operation;
a receiver circuit enabled to receive a second plurality of differential signals during a receiving mode of operation;
a switching circuit enabled to switch the transceiver circuit from the transmission mode to the receiving mode during a switching mode of operation; and
a tracking circuit enabled to track a common-mode voltage associated with the first and second plurality of differential signals if the switching mode of operation occurs, and control an amplitude of the common-mode voltage such that the amplitude of the common-mode voltage associated with the first plurality of differential signals is substantially equal to the amplitude of the common-mode voltage associated with the second plurality of differential signals if the switching mode of operation occurs.

2. The transceiver circuit of claim 1, wherein the switching circuit is further enabled to switch the transceiver circuit from the receiving mode to the transmission mode during the switching mode of operation.

3. The transceiver circuit of claim 1, further comprising a pre-emphasis output drive circuit, wherein the transmitter circuit is further enabled to transmit the first plurality of differential signals utilizing the pre-emphasis output drive circuit.

4. The transceiver circuit of claim 1, wherein the transmitter circuit is further enabled to transmit the first plurality of differential signals without utilizing a pre-emphasis output drive circuit.

5. The transceiver circuit of claim 1, wherein the tracking circuit comprises:
a variable resistive network, whereby a resistance of the variable resistive network is associated with an amplitude of the common-mode voltage; and
at least one switch enabled to control the resistance of the variable resistive network and the amplitude of the common-mode voltage.

6. The transceiver of claim 1, wherein the tracking circuit comprises:
a variable resistive network, whereby a resistance of the variable resistive network is associated with an amplitude of the common-mode voltage; and
at least one switch enabled to control the amplitude of the common-mode voltage, by controlling a resistance of the variable resistive network and conducting at least one of a main tail current and a pre-emphasis current through the variable resistive network.

7. The transceiver of claim 1, wherein the tracking circuit comprises:
a variable resistive network, whereby a resistance of the variable resistive network is associated with an amplitude of the common-mode voltage;
at least one transistor switch enabled to control a resistance of the variable resistive network such that a first resistance value is provided by the variable resistive network during the transmission mode of operation, and a second resistance value is provided by the variable resistive network during the receiving mode of operation; and
a transistor circuit enabled to track, during the receiving mode of operation, the amplitude of the common-mode voltage produced during the transmission mode of operation.

8. A method of operation of a transceiver circuit, comprising:
transmitting a first differential signal including a first common-mode voltage during a transmission mode of operation of the transceiver circuit;
tracking the first common-mode voltage during a receiving mode of operation of the transceiver circuit;
receiving a second differential signal including a second common-mode voltage during the receiving mode of operation; and
utilizing the tracking, controlling the second common-mode voltage such that the second common-mode voltage is substantially equal to the first common-mode voltage.

9. The method of claim 8, wherein the tracking comprises:
coupling a first resistive circuit between a supply voltage and a transmitter driver circuit during the transmission mode of operation;
coupling a second resistive circuit between the supply voltage and the transmitter driver circuit during the receiving mode of operation; and
controlling a current in the second resistive circuit to be substantially equal to a current in the first resistive circuit.

10. The method of claim 8, wherein the tracking comprises:
a transmitter driver circuit tracking a current associated with the first common-mode voltage during the receiving mode of operation; and
utilizing the current, controlling the second common-mode voltage.

11. The method of claim 8, further comprising:
a transmitter driver circuit transmitting the first differential signal during the transmission mode of operation, and providing a termination circuit for the second differential signal during the receiving mode of operation.

12. The method of claim 8, wherein the controlling comprises:
biasing a plurality of transistors to maintain a substantially similar Direct Current (DC) value in the receiving mode and the transmission mode.

13. The method of claim 8, wherein the tracking comprises:
tracking a main tail current and a pre-emphasis current established during the transmission mode or receiving mode.

14. The method of claim 8, wherein the tracking comprises tracking a current established during the transmission mode or receiving mode, and the current is associated with a predetermined value of a main tail current and a predetermined value of a pre-emphasis current.

15. The method of claim 8, further comprising:
rendering a transmitter driver circuit non-conducting during the receiving mode of operation.

16. A transceiver circuit, comprising:
a transmitter circuit enabled to transmit a first differential signal including a first common-mode voltage during a transmission mode of operation of the transceiver circuit;
a receiver circuit enabled to receive a second differential signal including a second common-mode voltage during a receiving mode of operation of the transceiver circuit; and
a plurality of transistors coupled to the transmitter circuit and the receiver circuit, the plurality of transistors enabled to track a first current associated with the first common-mode voltage during the receiving mode of operation, and utilizing the first current, control a second current associated with the second common-mode voltage such that the second common-mode voltage is substantially equal to the first common-mode voltage.

17. The transceiver circuit of claim 16, further comprising:
a first resistive circuit coupled between a supply voltage and the transmitter circuit during the transmission mode of operation; and
a second resistive circuit coupled between the supply voltage and the transmitter circuit during the receiving mode of operation.

18. The transceiver circuit of claim 16, further comprising:
a resistor network having a first resistance value coupled between a supply voltage and the transmitter circuit during the transmission mode of operation;
a resistor network having a second resistance value coupled between the supply voltage and the transmitter circuit during the receiving mode of operation; and
at least one transistor switch enabled to switch the resistor network from the first resistance value to the second resistance value during the transmission mode or the receiving mode.

19. The transceiver circuit of claim 16, further comprising:
a first resistive circuit coupled between a supply voltage and the transmitter circuit during the transmission mode of operation, the first resistive circuit enabled to conduct the first current; and
a second resistive circuit coupled between the supply voltage and the transmitter circuit during the receiving mode of operation, the second resistive circuit enabled to conduct the second current.

20. The transceiver circuit of claim 16, further comprising:
a first resistive circuit coupled between a supply voltage and the transmitter circuit during the transmission mode of operation, the first resistive circuit enabled to conduct the first current; and
a second resistive circuit coupled between the supply voltage and the transmitter circuit during the receiving mode of operation, the second resistive circuit enabled to conduct the second current, wherein the second current is substantially equal to the first current.

21. The transceiver circuit of claim 17, wherein the first resistive circuit and the second resistive circuit comprise a controllable resistor network.

22. The transceiver circuit of claim 16, wherein at least one of the first current and the second current comprises a pre-emphasis current and a tail current.

* * * * *